(12) United States Patent
Mandelman et al.

(10) Patent No.: US 6,284,593 B1
(45) Date of Patent: Sep. 4, 2001

(54) METHOD FOR SHALLOW TRENCH ISOLATED, CONTACTED WELL, VERTICAL MOSFET DRAM

(75) Inventors: Jack A. Mandelman, Stormville; Ramachandra Divakaruni, Somers; Carl J. Radens, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/705,652

(22) Filed: Nov. 3, 2000

(51) Int. Cl.⁷ .................................................. H01L 21/8242
(52) U.S. Cl. ......................... 438/248; 438/243; 438/244; 438/245; 438/246; 438/247; 438/249; 438/386; 438/387; 438/388; 438/389; 438/390; 438/391; 438/392
(58) Field of Search ................................ 438/243–249, 438/386–392

(56) References Cited

U.S. PATENT DOCUMENTS

| | | | | |
|---|---|---|---|---|
| 5,380,674 | * | 1/1995 | Kimura et al. | 438/241 |
| 5,422,294 | * | 6/1995 | Noble, Jr. | 438/246 |
| 5,744,386 | * | 4/1998 | Kenney | 438/245 |
| 5,937,296 | * | 8/1999 | Arnold | 438/270 |
| 6,040,213 | * | 3/2000 | Canale et al. | 438/243 |
| 6,143,599 | * | 11/2000 | Kim et al. | 438/243 |
| 6,172,390 | * | 1/2001 | Rupp et al. | 257/302 |
| 6,190,971 | * | 2/2001 | Gruening et al. | 438/270 |
| 6,200,873 | * | 3/2001 | Schrems et al. | 438/386 |
| 6,204,140 | * | 3/2001 | Gruening et al. | 438/386 |
| 6,225,158 | * | 5/2001 | Furukawa et al. | 438/243 |

\* cited by examiner

Primary Examiner—Jey Tsai
Assistant Examiner—Jennifer M. Kennedy
(74) Attorney, Agent, or Firm—Scully, Scott, Murphy & Presser; Todd M.C. Li

(57) ABSTRACT

A process of forming a hybrid memory cell which is scalable to a minimum feature size, F, of about 60 nm at an operating voltage of $V_{blh}$ of about 1.5 V and substantially free of floating-well effects is provided.

15 Claims, 22 Drawing Sheets

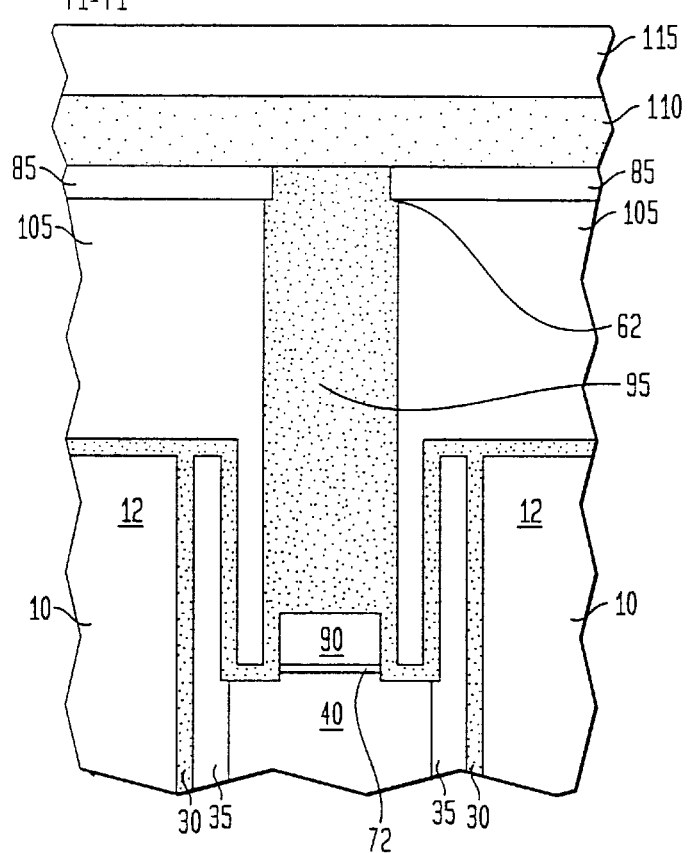
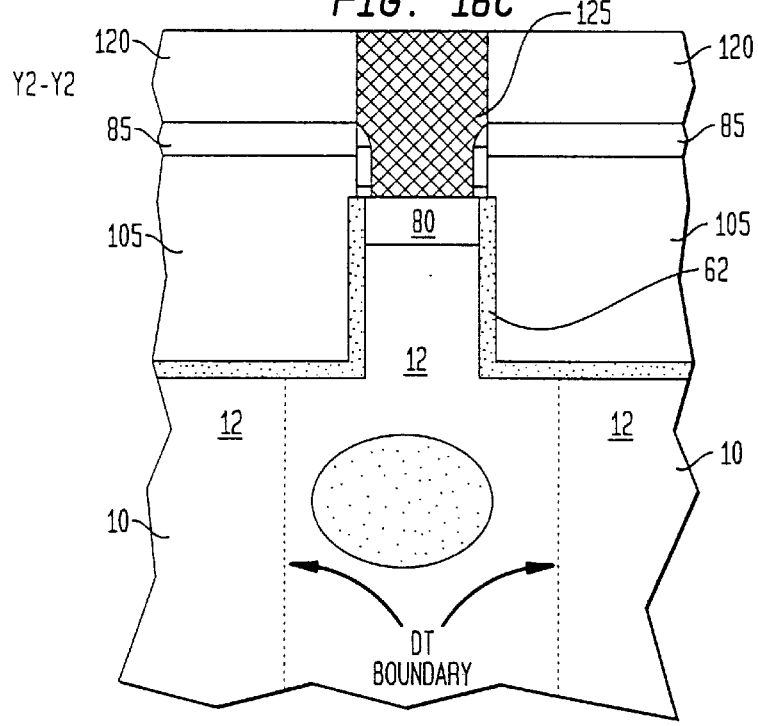

METHOD FOR SHALLOW TRENCH ISOLATED, CONTACTED WELL, VERTICAL MOSFET DRAM

RELATED APPLICATIONS

This application is related to co-assigned U.S. patent application Ser. Nos. 09/706,482 and 09/706,468, both of which are filed concurrently with this application.

FIELD OF THE INVENTION

The present invention relates to semiconductor memory cell arrays, and more particular to a process for forming an ultra-scalable hybrid-type memory cell array. Specifically, the present invention is directed to a process of forming a hybrid-type memory cell which is scalable to a minimum feature size, F, of about 60 nm at operating voltages of $V_{b1h}$ of about 1.5 V.

BACKGROUND OF THE INVENTION

As conventional vertical DRAM cells are scaled below a design groundrule of about 110 nm, encroachment of the buried-strap region upon the sidewall of the adjacent storage trench cuts-off the path holes flowing into and out of the portion of the P-well above the buried-strap region.

Simulation has demonstrated that floating-well effects limit the scalability of prior art vertical DRAM memory arrays to a minimum distance of about 90 nm between adjacent storage trenches. A number of dynamic leakage mechanisms limiting the scalability of conventional vertical DRAM memory cells have been identified and quantified. Included in the dynamic leakage mechanisms are: (1) Floating-well bitline disturb (FWBD), (2) Transient drain induced barrier lowering (TDIBL), and (3) Adjacent wordline induced punchthrough (AWIPT).

The onset of serious charge loss due to each mechanism occurs at approximately 90 nm end of process deep trench (DT) to deep trench (DT) spacing. Thus, scalability of conventional vertical DRAM memory cells beyond 110 nm is expected to be limited by floating-well effects.

An illustration of a dominant floating-well dynamic leakage mechanism that limits scalability of prior art vertical DRAM memory arrays is shown in FIG. 1. Specifically, at a time indicated by point A of FIG. 1 and during a long period of about 5–100 ns of repeated writing of a "1" to other memory cells on the bitline, the P-well of an unselected cell storing a "1" may leak up towards $V_{b1h}$, as the exiting of holes is restricted by parasitic JFET. Leakage depends on the degree of well isolation caused by pinchoff from expansion of the storage node depletion region. In an extreme case, the buried-strap region may come in contact with the adjacent deep trench capacitor. Moreover, the hole current through the pinchoff region must keep up with the leakage to avoid a pseudo "Floating-Body Effect".

Insofar as time interval B-C is concerned, the N+ bitline diffusion to P-well barrier is lowered by a downward swing of $V_{b1h}$. Electrons emitted from the bitline diffusion region are collected by the storage node resulting in the formation of a parasitic bipolar transistor, $Q_B$, ($PW_{int}$ is a floating base) within the memory cell array.

For aggressively scaled vertical metal oxide semiconductor field effect transistors (MOSFETs) in prior art vertical DRAM memory cells, the depletion region from the storage node diffusion (i.e., buried-strap outdiffusion) encroaches upon the sidewall of the adjacent storage trench, which results in dynamic charge loss from the storage capacitor as the bitline of an unselected device is cycled. This charge loss mechanism is identical to that published in "Floating-Body Concerns for SOI Dynamic Random Access Memory (DRAM)", Proceedings, 1996 IEEE International SOI Conference, Jack Mandelman, et al. pp. 1367–137, October 1996.

An illustration of the storage capacitor voltage vs. the voltage in the portion of the P-well isolated by the depletion region from the buried-strap outdiffusion, as the bitline is cycled, is shown in FIG. 2. When the bitline is held at $V_{b1h}$, the isolation portion of the P-well leaks up towards the voltage of the adjacent diffusions. With subsequent cycling of the bitline between 0.0 and $V_{b1h}$, the dynamic charge loss mechanism results in charge pumping which discharges the storage capacitor. Between data refresh, greater than $10^6$ bitline cycles are possible, which is sufficient to discharge the storage capacitor.

One possible solution to the scalability limitation resulting from floating-well effects, which has not yet been implemented in existing memory structures, includes a contact to the portion of the P-well above the buried-strap outdiffusion region. If such a memory structure is possible, it must be provided in a manner that does not negatively impact cell density, does not degrade junction leakage, and does not add to the fabrication complexity. To date, applicants are unaware of a prior art vertical DRAM memory structure of this type that overcomes the scalability limitation resulting from floating-well effects.

The present invention provides a processing scheme which provides a contacted body and maintains low junction leakage, while actually reducing fabrication cost, retarding the onset of scalability limitations due to floating-well effects to approximately 60 nm groundrules.

SUMMARY OF THE INVENTION

One object of the present invention is to provide a process of forming a hybrid memory cell array ($6F^2$) which avoids strap-to-strap leakage problems to a minimum feature size, F, of about 60 nm at operating voltages of $V_{b1h}$ of about 1.5 V.

Another object of the present invention is to provide a process of forming a hybrid memory cell array wherein the floating-well effects are substantially eliminated.

A further object of the present invention is to provide a process of forming a hybrid memory cell array which has tighter support groundrules.

A still further object of the present invention is to provide a process of forming a hybrid memory cell array in which a low-aspect ratio shallow isolation trench (SIT) region is employed.

A yet further object of the present invention is to provide a process of forming a hybrid memory cell array having improved narrow width effects.

An even further object of the present invention is to provide a process of forming a hybrid memory cell array wherein the spaces between the SIT regions may be greater than 1F without critical overlay in the array.

These and other objects and advantages are achieved by employing the process of the present invention which includes the steps of:

(a) forming at least one deep trench capacitor in a Si-containing substrate, said at least one deep trench capacitor including at least a deep trench polysilicon material, a trench oxide formed on said deep trench polysilicon material, a liner formed on said trench oxide and interior walls of a collar oxide region, and a polysilicon placeholder material formed on said liner;

(b) patterning said polysilicon placeholder material using at least a hardmask to cover a middle portion of said deep trench capacitor and selectively etching exposed portions of said polysilicon placeholder material stopping on said liner;

(c) removing exposed portions of said liner stopping on said trench oxide so as to expose portions of said trench oxide and removing said exposed portions of said trench oxide stopping on said deep trench polysilicon material;

(d) oxidizing any exposed sidewalls and providing a planarized layer of oxide in said etched areas so as to form shallow isolation trench regions which have a depth that is substantially above a buried-strap outdiffusion region to be subsequently formed thereby not cutting into said buried-strap outdiffusion region, yet being deep enough to isolate adjacent bitline diffusion regions to be subsequently formed;

(e) removing said hard mask from said middle portion of the deep trench capacitor, and selectively etching through said remaining polysilicon placeholder material, liner and trench oxide so as to expose a portion of said deep trench polysilicon material;

(f) providing a strap opening in said deep trench capacitor and forming a one-sided buried-strap outdiffusion region through said strap opening, said one-sided buried strap outdiffusion region being confined to a substantially center portion of the deep trench capacitor;

(g) forming bitline diffusion regions about said deep trench capacitor; and (h) forming a new trench oxide on said exposed portion of said deep trench polysilicon and forming a gate conductor on said trench oxide.

The inventive process further comprises forming wordlines above said deep trench capacitor, forming borderless bitline contacts adjacent to said wordlines and forming bitlines above and perpendicular to said wordlines that are in contact with said bitline contacts.

BRIEF DESCRIPTION OF THE DRAWINGS

FIG. 5A is a graph of mid-band electron potential (V) vs. lateral distance ($\mu$m); while In FIGS. 6–16, top views are shown as well as cross-sectionals through various cuts including through the deep trench region, Y1—Y1; and through the SIT region, Y2—Y2. In some instances, cut X—X which represents a cross-section perpendicular to Y1—Y1 and Y2—Y2, in a plane containing both storage trench and body of the vertical MOSFET, is shown.

DETAILED DESCRIPTION OF THE INVENTION

Figure 1:
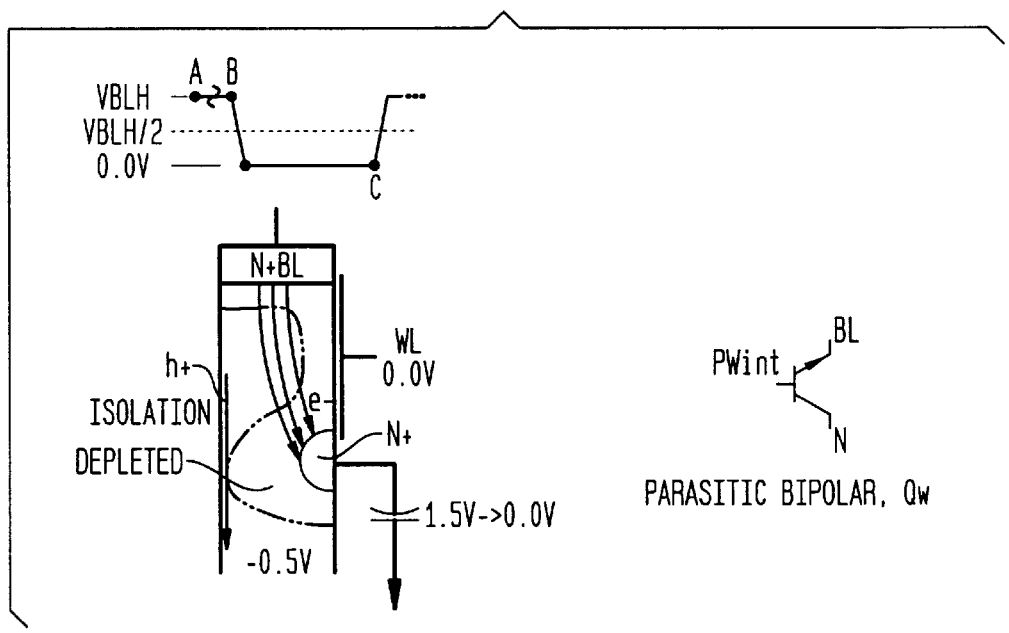
FIG. 1 is a schematic that explains the floating well-effects in a conventional hybrid memory cell.
Figure 2:
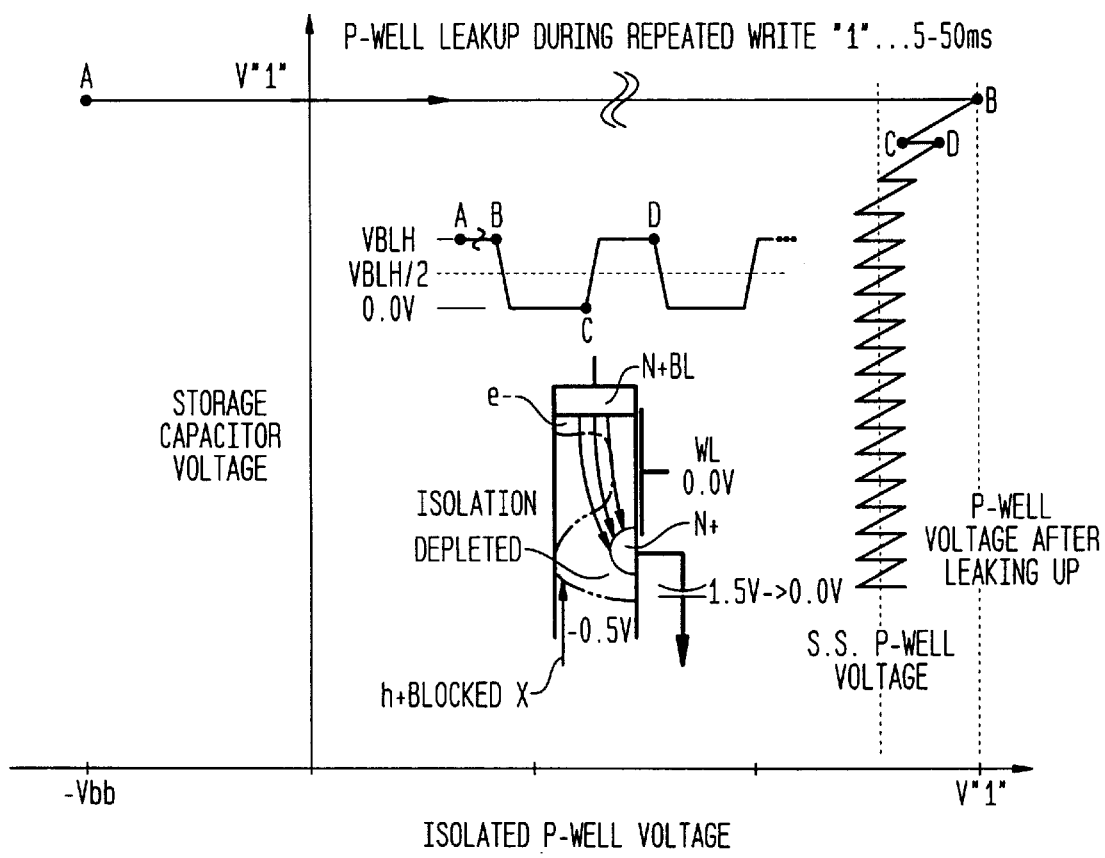
FIG. 2 is an illustration of storage capacitor charge loss with repeated bitline cycling in an unselected conventional hybrid memory cell.

The present invention which provides a process of forming a hybrid dynamic random access memory (DRAM) cell array which avoids stored charge loss due to floating-well effects to a minimum feature size of about 60 nm at an operating voltage of $V_{blh}$ of about 1.5 V will now be described in greater detail by referring to the drawings that accompany the present application.

Figure 3A:
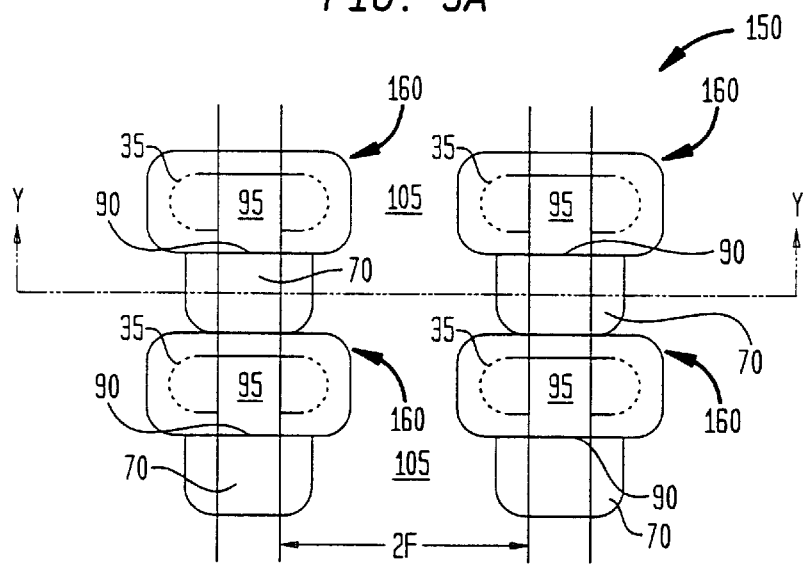
FIGS. 3A–B are pictorial representations of a portion of the inventive hybrid memory cell.
Figure 3B:
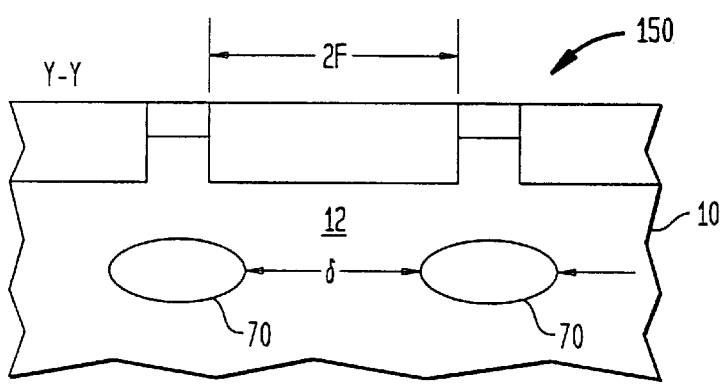

Reference is made to FIGS. 3A–B that illustrate a portion of the inventive ultra-scalable hybrid memory cell array. Specifically, FIG. 3A is a top view of the inventive hybrid memory cell array which includes a plurality of vertical DRAM cells 150 arranged in rows and columns. In FIG. 3A, the illustrated elements of the vertical DRAM include gate conductor 95, gate oxide 90 and collar oxide 35 which is formed entirely around the gate conductor except for a small aperture in which buried-strap region 70 and channel of the vertical MOSFET are present. In accordance with the present invention, each vertical memory cell, i.e., DRAM, is formed in a storage trench that is present in a P-well of a Si-containing substrate and each vertical memory cell includes a MOSFET region formed over a storage capacitor. The MOSFET region and the storage capacitor of the inventive memory cell array are electrically connected to each other by a one-sided buried-strap outdiffiusion region 70. The one-sided buried-strap outdiffusion region is confined to a substantially center portion of the storage trench and it may extend essentially to the adjacent vertically memory cell present in the same column.

The memory cell shown in FIG. 3A also includes shallow isolation trench (SIT) regions 105 located between adjacent columns of memory cells. In accordance with the present invention, each shallow isolation trench region has a depth that is substantially above the one-sided buried-strap outdiffusion region thereby not cutting into the one-sided buried-strap outdiffusion region, yet being deep enough to isolate adjacent bitline diffusion regions that abut each vertical memory cell; See FIG. 3B.

Specifically, FIG. 3B is a cross-sectional view of the hybrid memory cell through cut Y—Y, i.e., the N+ buried-strap diffusion region. As shown, the hybrid memory cell includes SIT regions 105 which are formed in a P-well region 12 of a Si-containing substrate 10. Bitline diffusion regions 80 are located in the P-well region between each STI region. Beneath each bitline diffusion, is buried-strap outdiffusion region 70.

It should be noted that there are several novel features contained in the above cell which allow a contact to the P-well (above the strap) to be formed without impacting junction leakage, cell area and fabrication cost. Included are (1) The collar oxide covers the entire perimeter of the top portion of the storage trench except for approximately a 1F wide opening which contains the strap and gate oxide of the vertical metal oxide semiconductor field effect transistor (MOSFET); and (2) the shallow isolation trench regions, e.g., SIT regions, are just deep enough to cut the bitline diffusion (and the source/drain diffusions in the support circuitry, not shown). In the inventive hybrid memory cell array, the bottom of the SIT is substantially above the top portion of the strap diffusion. This means that a greatly reduced aspect ratio SIT may be used in the supports circuitry as well as the array, facilitating etching and filling, while allowing tighter groundrules. Furthermore, since the bottom of the SIT region is now well above the strap diffusion, sub-trench isolation leakage is better controlled with a higher doping concentration without increasing the background doping at the strap.

Figure 4:
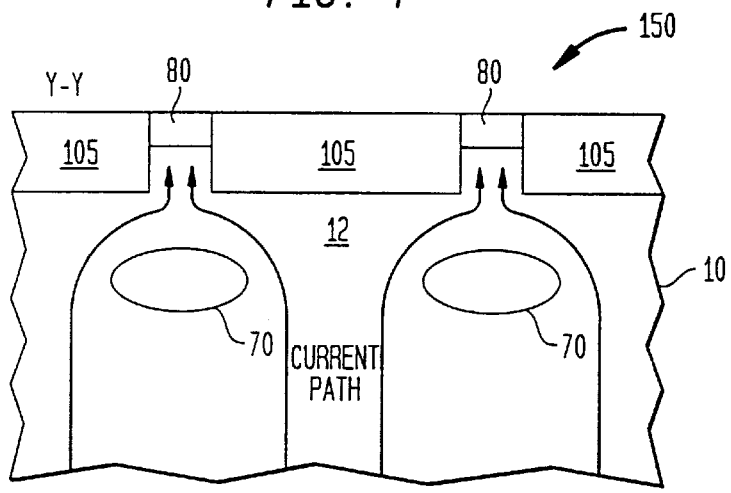
FIG. 4 is an illustration showing the electrical continuity to the upper portion of the P-well.

As shown in FIG. 4, electrical continuity between the deep portion of the P-well (biased at $V_{bb}$, typically −0.5 V)

and the portion of the P-well above the strap is obtained by hole flow around the depletion region surrounding the strap diffusion. In accordance with the present invention, the SIT regions are sufficiently shallow (greater than 40 nm above the strap diffusion junction) to allow a non-depletion portion of the P-well to remain between the strap diffusion and the bottom of the SIT. Since the conductive region which provides P-well continuity is original single crystal silicon, junction leakage due to a depletion region abutting a polycrystalline contact is not a concern.

An additional benefit resulting from shallower isolation regions, i.e., SIT regions, is that the space between SIT regions may be greater than about 1F, eliminating critical overlay, since the strap aperture (i.e., opening) is no longer defined by the isolation trench. This allows for relaxed groundrules and larger bitline contact area. One remaining question which needs to be addressed is how close (δ) may the adjacent strap diffusion be without exceeding a punch-through current of about 1fA/$\mu$m.

Figure 5A:
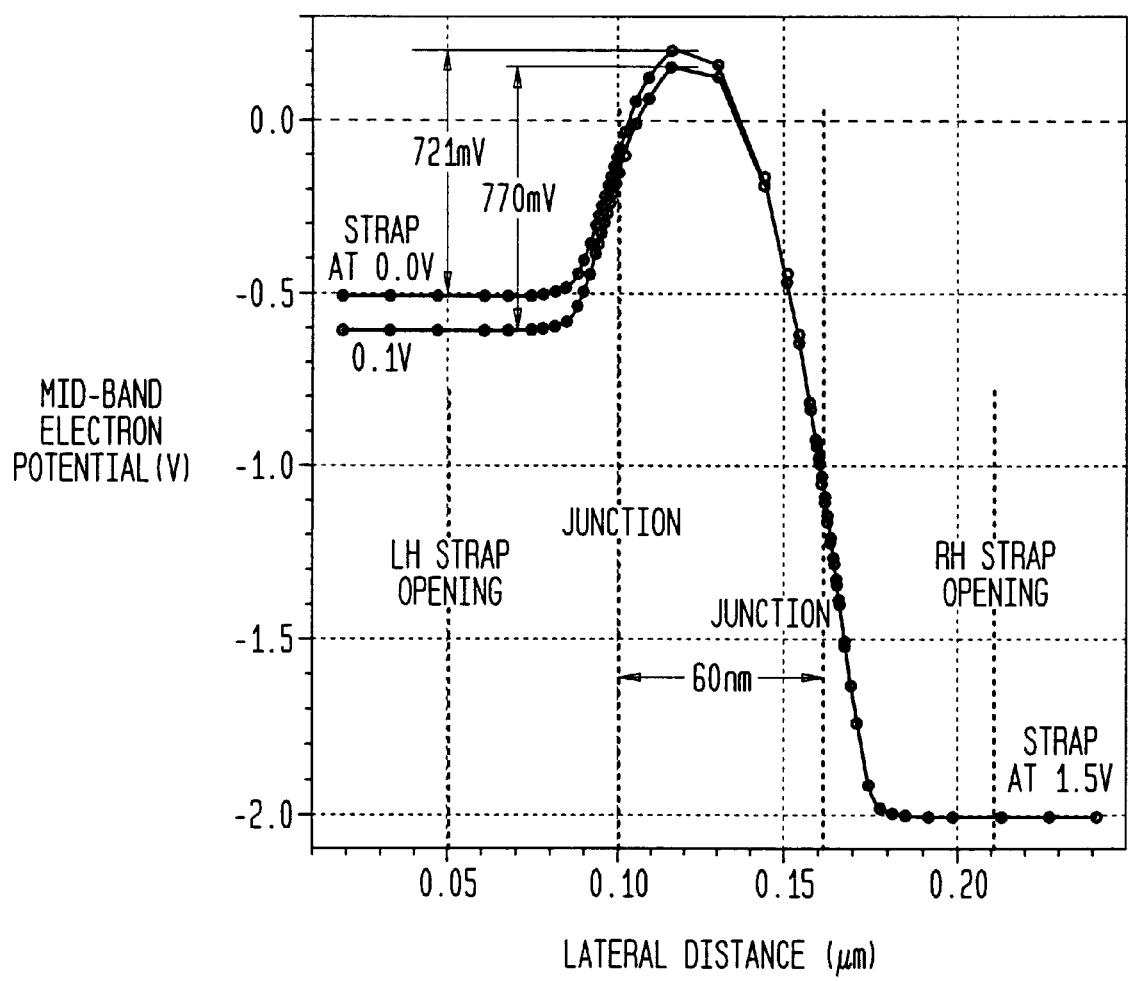

Simulations have demonstrated that, with the thermal budget practiced for conventional hybrid cells of the prior art, the amount of strap outdiffusion normal to the sidewall of the storage trench can easily be limited by approximately 50 nm. It has been further found that the amount of diffusion tangential to the sidewall of the storage trench is approximately 30 nm. Using the above value for tangential outdiffusion, and referring again to FIG. 3, applicants have deduced that a spacing between strap diffusions, δ, of about 2F-60 nm, wherein F is the minimum feature size, can be employed. As can be seen from the simulated potential between straps in FIG. 5A, lowest strap-strap punchthrough barrier occurs when the low-node is zero, for a constant voltage on the adjacent strap, due to drain induced barrier lowering. This means that the highest strap-strap leakage occurs when a "1" is stored on one node and 0.0 V on the adjacent node.

Figure 5B:
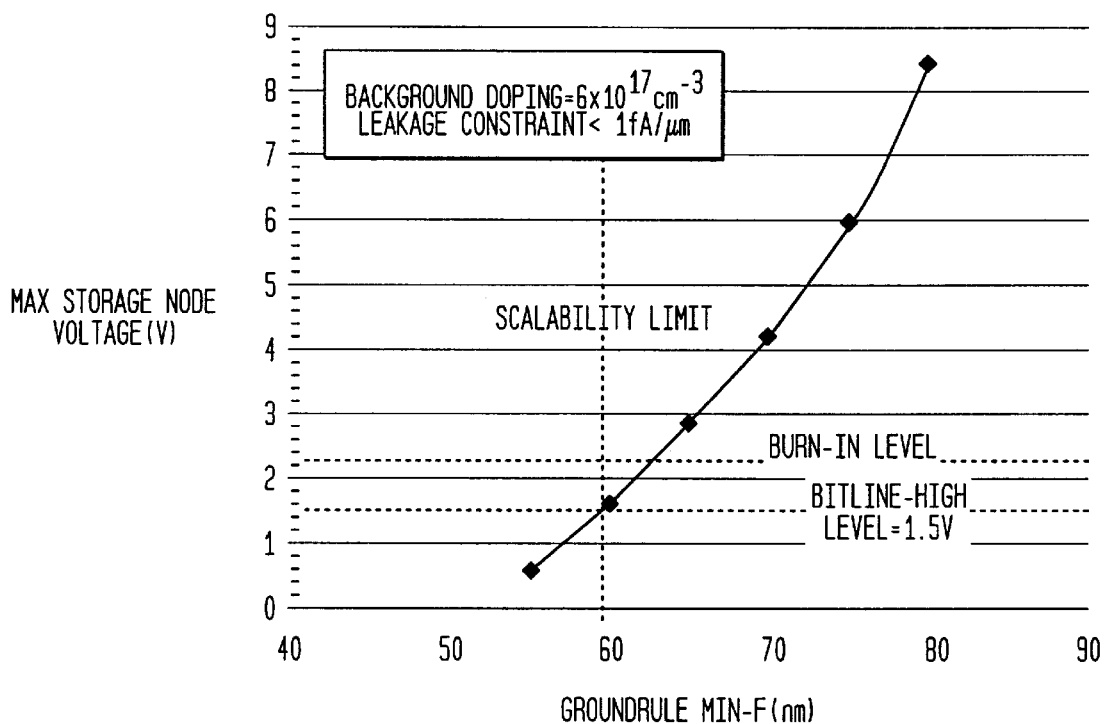
FIG. 5B is a graph of maximum storage node voltage (V) vs. groundrule minimum-F (nm).

FIG. 5B plots simulated results of the maximum voltage which can be applied to one strap diffusion (storage node voltage), with the adjacent strap diffusion held at zero volts, to produce a leakage current of about 1 fA/$\mu$m, as a function of the feature size, F. The empirical P-well doping constraint of about $6 \times 10^{17}$ cm$^3$ has been applied to assure that the tail of retention time distribution is not degraded by defect enhanced junction leakage. As can be seen in FIG. 5B, the leakage constraint is satisfied for a stored "1" of about 1.5 V for a design groundrule smaller than about 60 nm. This corresponds to a diffusion spacing (δ) of about 58 nm. Therefore, acceptable diffusion to diffusion leakage obtained without the usage of prior art isolation trenches, i.e., STIs, for spacing smaller than about 60 nm, which is an unexpected result that enables extreme scaling of the inventive hybrid cell.

The processing scheme, which is employed in the present invention in fabricating the above-described ultra-scalable hybrid memory cell, will now be described in detail by referring to FIGS. 6–16 which illustrate the various processing steps of the present invention. As stated above, top views are shown as well as cross-sectional views through various cuts including through the deep trench region, Y1—Y1; through the SIT region, Y2—Y2; and through the deep trench and vertical MOSFET body region, X—X Reference is made to FIG. 6A (top view) and 6B (cross-sectional through cut Y1—Y1) of a deep trench capacitor of the inventive hybrid memory cell. It is noted that only the upper region (above the node dielectric) of the storage trench is shown in the drawings. Specifically, the deep trench capacitor shown in FIGS. 6A–6B includes a Si-containing substrate 10 having at least one deep trench region 15 formed therein. The term "deep trench" is used herein to denote a trench whose depth from the top surface of the Si-containing substrate is about 1.0 $\mu$m or greater. The deep trench capacitor structure also includes a horizontal pad SiN layer 20 and a thin oxide layer 25 formed on said structure. In accordance with the present invention, the thin oxide layer has a thickness of about 15 nm or less and it is comprised of densified TEOS (tetraethylorthosilicate) or a high density plasma (HDP) oxide.

The deep trench region includes a first SiN liner 30 which lines the interior walls (sidewalls and bottom wall) of the deep trench, a collar oxide region 35 formed in a portion of the deep trench on said first SiN liner, deep trench polysilicon 40 formed in a lower portion of the deep trench, a trench oxide layer 41 formed on said deep trench polysilicon, a second SiN liner 42 lining exposed walls of said collar oxide and the surface of the trench oxide, and a polysilicon placeholder material 43 formed in the upper region of the deep trench region. It should be noted SiN liner 30 may be replaced with another liner which may also serve as an etch stop layer.

Figure 6A:
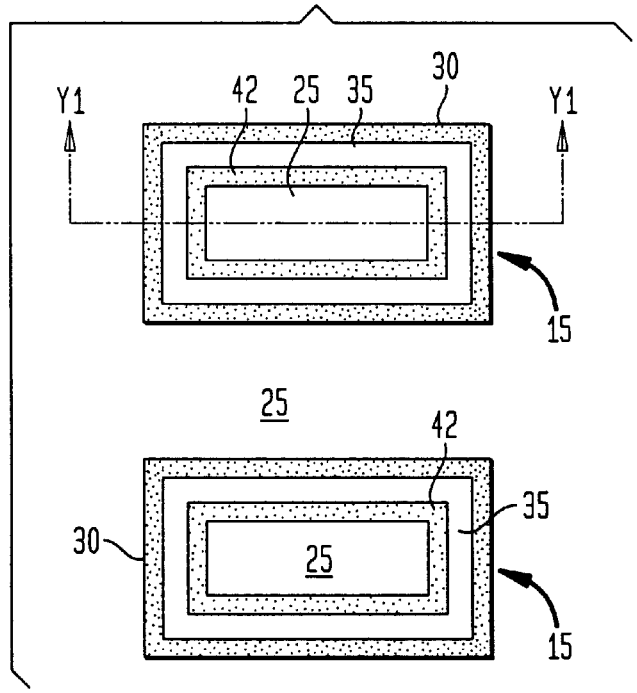
FIGS. 6–16 are pictorial views illustrating the inventive hybrid memory cell through various processing steps of the present invention.
Figure 6B:
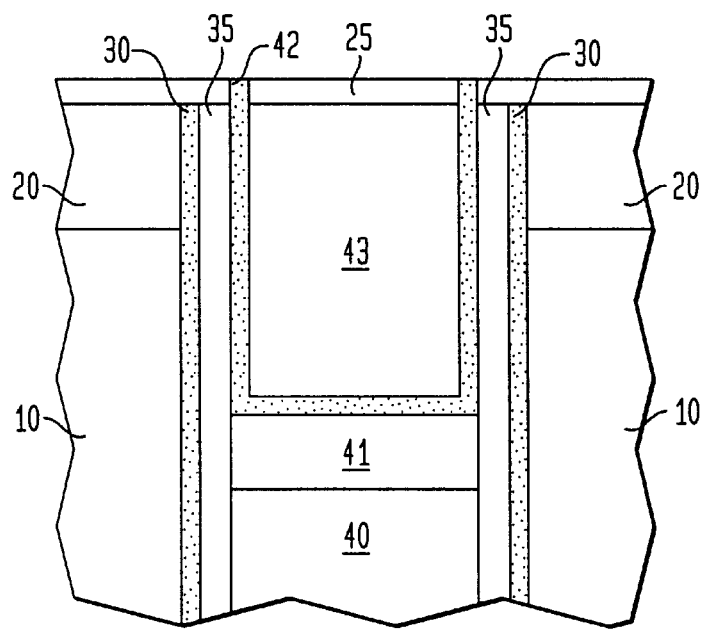
Figure 7A:
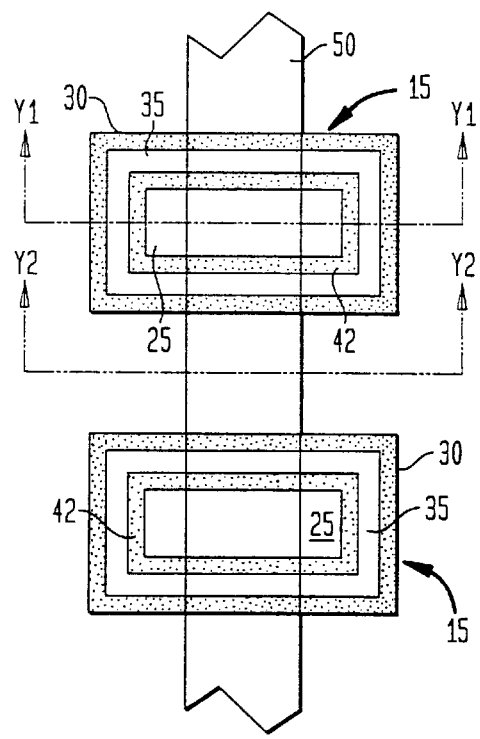
Figure 7B:
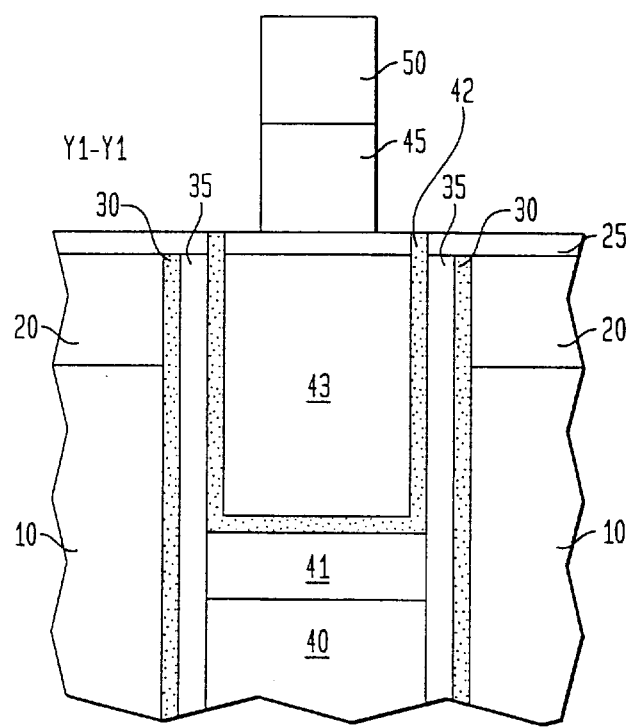
Figure 7C:
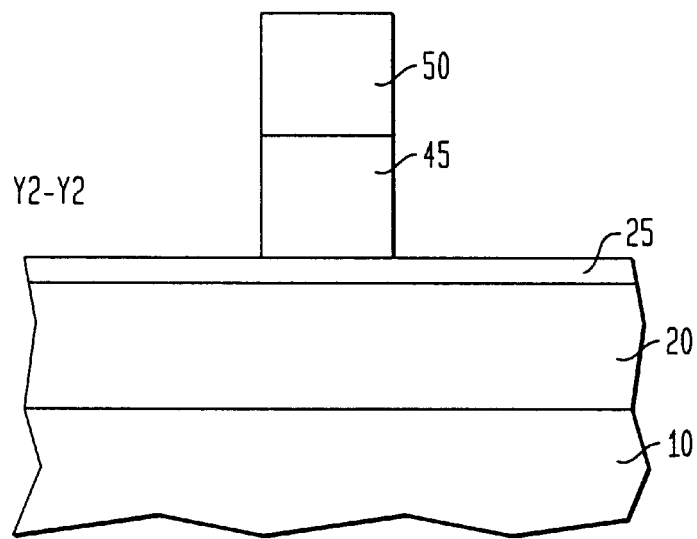
Figure 8A:
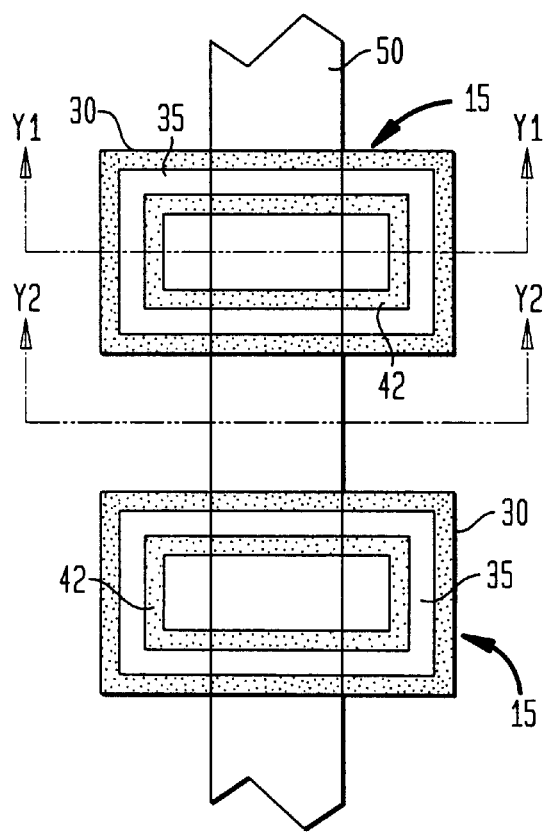
Figure 8B:
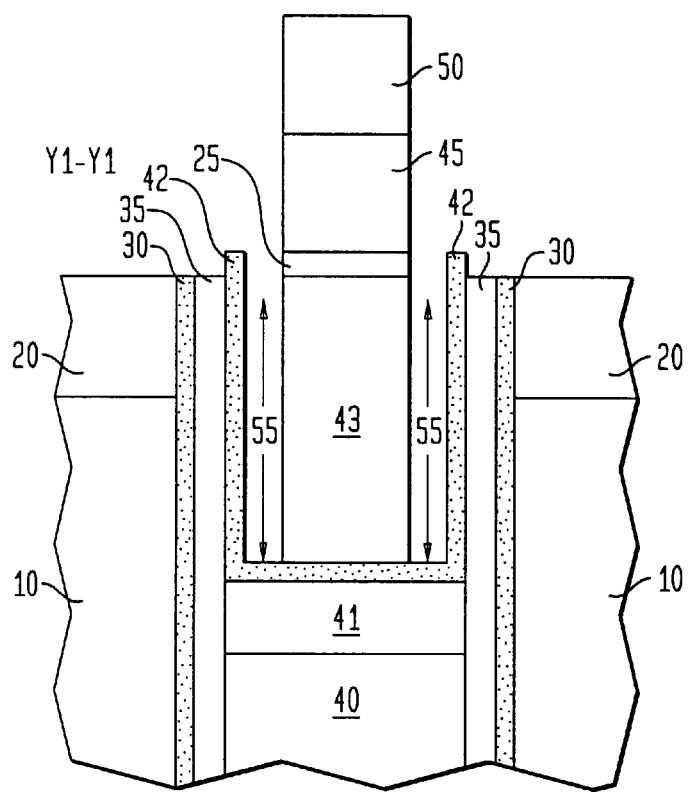
Figure 8C:
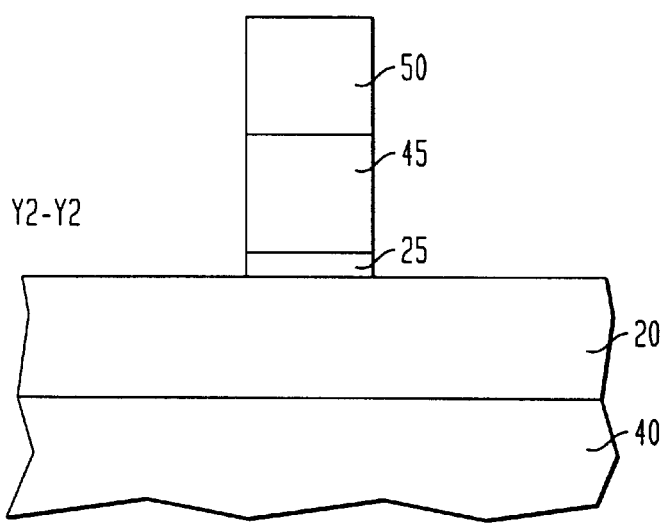

The deep trench structure shown in FIGS. 6A–6B is formed utilizing the following processing steps: First, a pad structure consisting of a thin (5 nm or less) thermally grown oxide not shown), a deposited layer of SiN 20, and a customary TEOS or boron silicate glass (BSG) hardmask layer (not shown) is formed on the surface of the Si-containing substrate. Deep trench storage capacitors, one of which is shown in drawings, are then formed in the customarily practiced manner of opening a trench pattern in the pad structure via lithography and anisotropically etching the Si-containing substrate to a predetermined depth. The trench opening is then lined with first SiN liner 30. Next, a polysilicon buffered LOCOS (local oxidation of silicon) collar or other type of collar oxide 35 is formed in an upper portion of the deep trench, a buried plate diffusion (not shown) is formed in a lower portion of the deep trench, and a node dielectric layer (not shown) is formed about said buried plate diffusion. The trench is filled with doped polysilicon (i.e., deep trench polysilicon) 40 and planarized utilizing a conventional planarization process such as chemical-mechanical polishing (CMP). The deep trench polysilicon is recessed by conventional means to a depth which is desired for the strap (determines the channel length of the vertical metal oxide semiconductor field effect transistors (MOSFETs)). A layer of oxide (i.e., trench oxide) such as HDP oxide 41 is deposited to a thickness of from about 10 to about 50 nm on the surface of the recessed deep trench polysilicon. Second nitride liner 42 is thereafter deposited in the deep trench so as to line the exposed walls of the collar oxide and on the surface of the trench oxide.

Polysilicon placeholder material 43 is then deposited and planarized to the top surface of pad SiN layer 20. The planarization process removes substantially the entire oxide and most of the TEOS or BSG hardmask from the stack structure. Any residual TEOS or BSG hardmask may be removed with a chemical etchant such as HF/sulfuric acid or HF vapor. Thin oxide layer 25, which serves as a hard mask, is next deposited by conventional deposition processes. FIGS. 6A–6B show the resultant structure at this point of the inventive process.

After forming the deep trench capacitor structure in the Si-containing substrate, another layer of SiN 45 is deposited on the surface of the structure by a conventional deposition process and thereafter photoresist 50 is formed on SiN layer 45. The photoresist is then exposed and patterned into lines and spaces. The intersection of photoresist lines will subsequently define the location of the strap opening and the gate of the vertical MOSFET. Using the photoresist stripes as a mask, SiN layer 45 is anisotropically etched selective to $SiO_2$ and silicon, stopping on the oxide layer providing the structure shown in FIGS. 7A, 7B and 7C.

Next, the exposed thin oxide is etched selective to polysilicon and photoresist. The placeholder polysilicon over the deep trench polysilicon is now anisotropically etched selective to SiN, oxide and photoresist so as to recess exposed portions of the placeholder polysilicon material to the top of SiN layer 42. The above processing steps lead to the formation of recessed area 55 in the structure shown in FIGS. 8A, 8B and 8C.

Figure 9A:
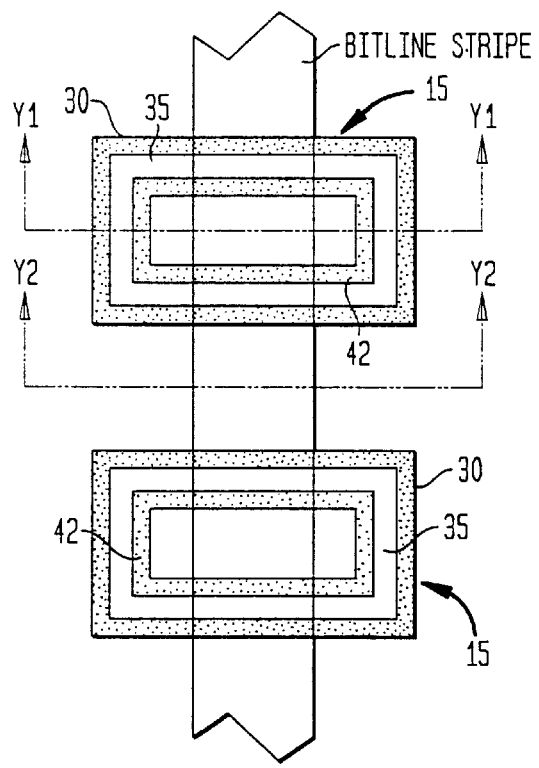
Figure 9B:
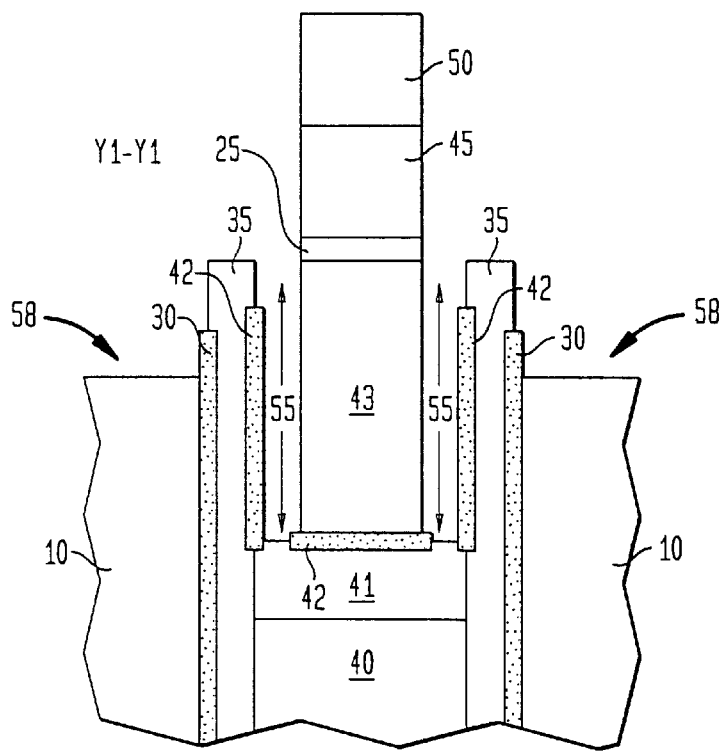
Figure 9C:
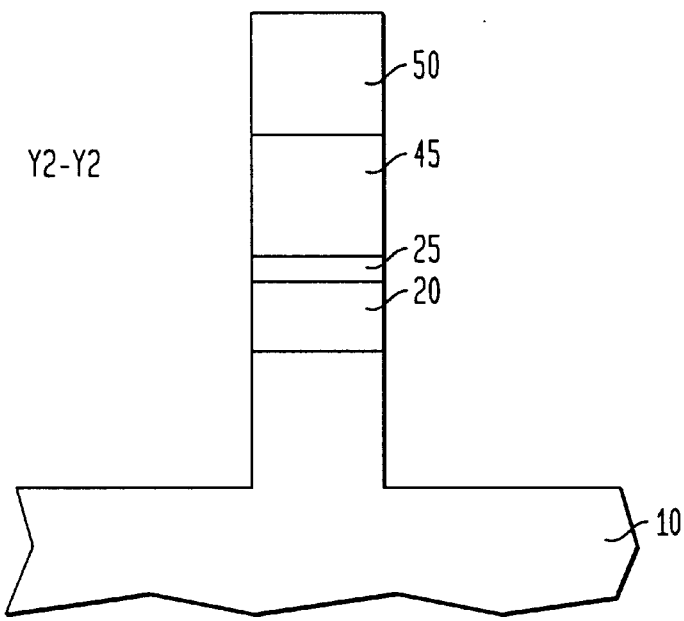
Figure 10A:
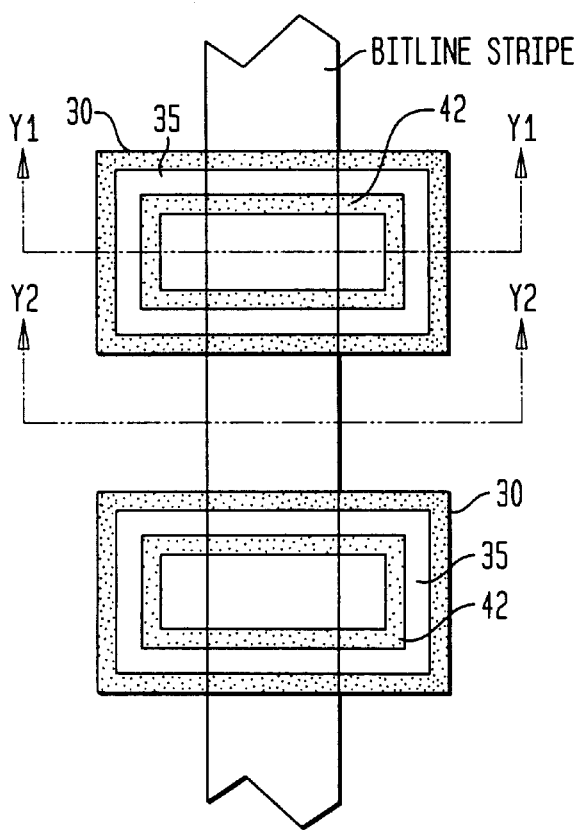
Figure 10B:
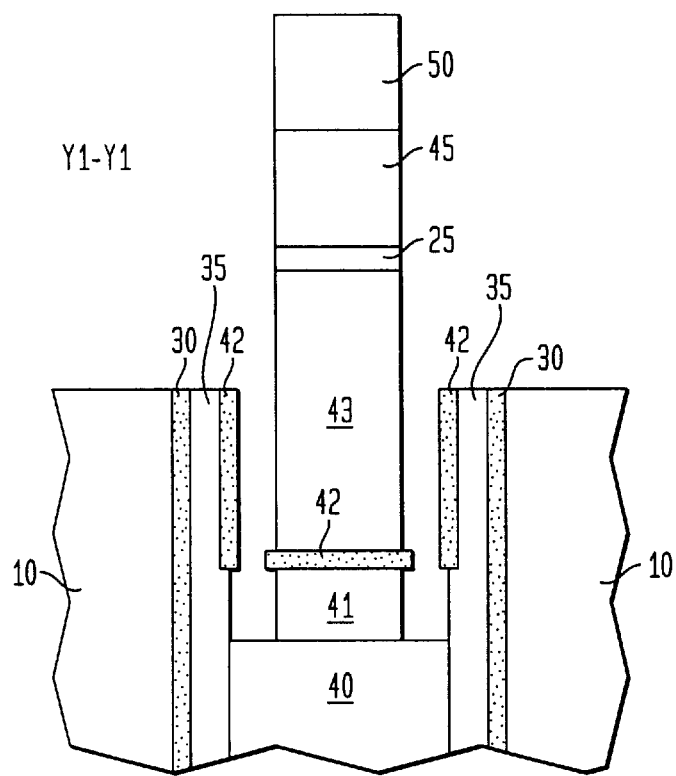
Figure 10C:
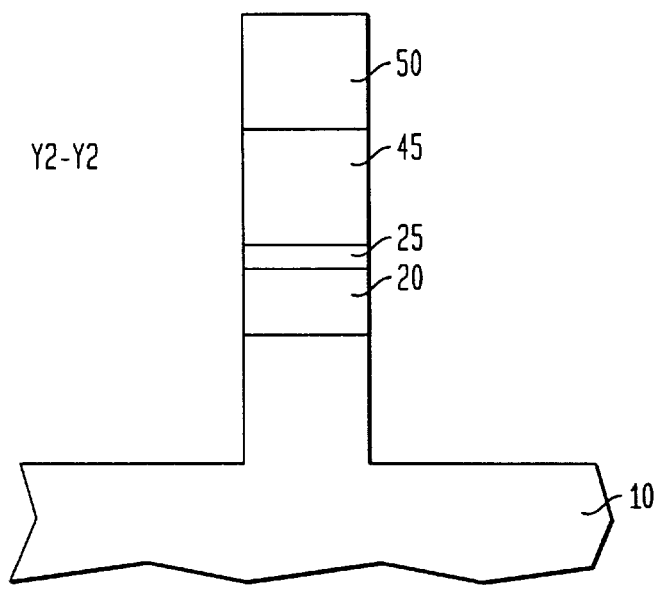

Following recessing of the exposed placeholder polysilicon to the top of SiN layer 42, the exposed portion of the pad SiN layer is reactive-ion etched (RIEd) selective to photoresist and oxide. This RIE step also removes the SiN liner 42 from the exposed horizontal surfaces. The exposed Si-containing substrate is then RIEd selective to the photoresist and oxide so as to-form shallow recesses 58 for the subsequent formation of shallow isolation trench (SIT) regions. The resultant structure formed these processing steps is illustrated in FIGS. 9A, 9B and 9C.

The exposed portion of the trench oxide over the deep trench polysilicon is then etched by a RIE process which is selective to silicon and photoresist. This step of the inventive process is continued such that the top of the collar ears is level with the bottom of the shallow trench, See FIGS. 10A, 10B and 10C.

Figure 11A:
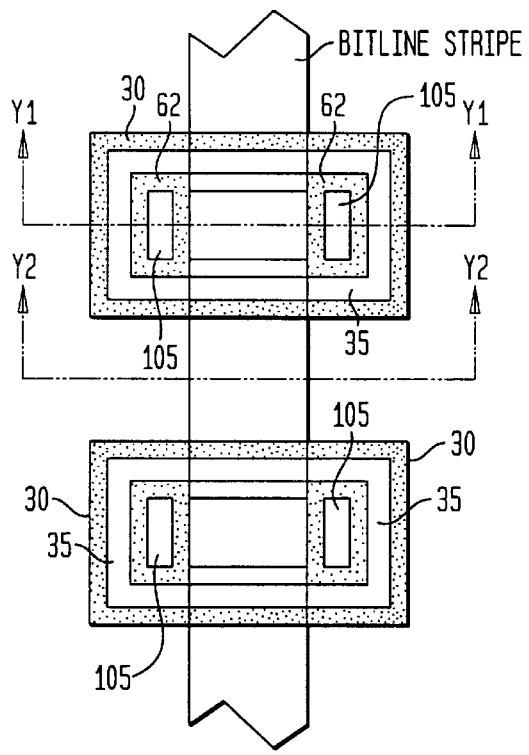
Figure 11B:
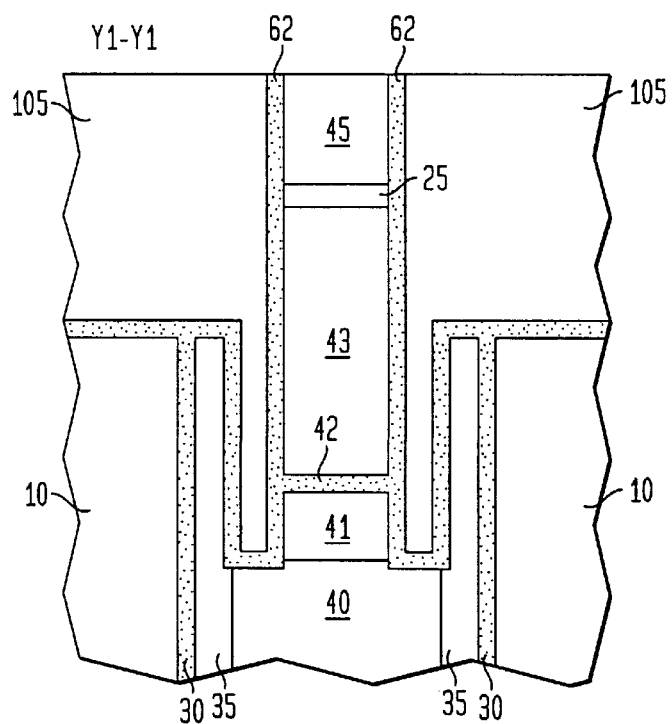
Figure 11C:
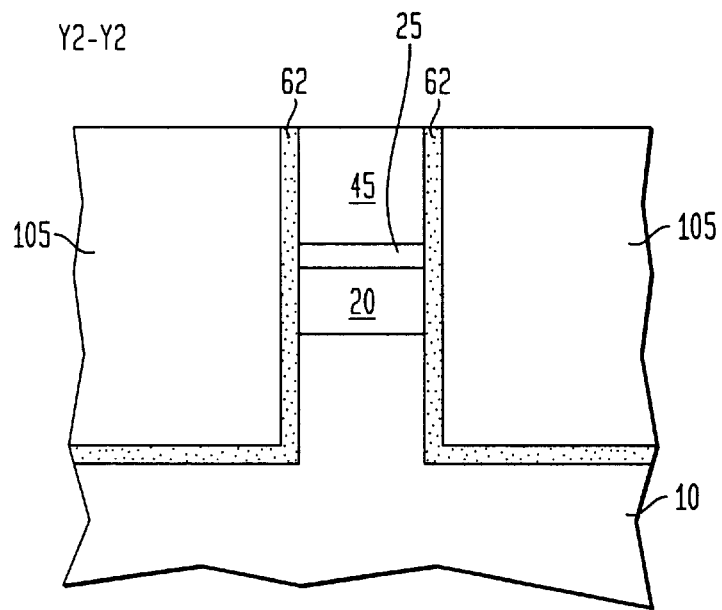

After removal of the exposed portion of the trench oxide over the deep trench polysilicon and leveling of the collar ears, the structure shown in FIGS. 11A, 11B and 11C is provided. Specifically, the structure shown in these drawings is formed by first removing photoresist 50 by utilizing a conventional stripping process. A customary active area oxidation is next performed, followed by the deposition of a nitride liner. It is noted that in FIGS. 11A, 11B and 11C reference numeral 62 is used to denote both the oxide liner and nitride liner produced above. Then, an oxide 105 such as TEOS or HDP oxide is deposited and planarized to the top surface of second SiN layer 45. It is noted that the oxide layer 105 is the SIT region of the present invention. It is noted that in the inventive memory cell array, the SIT regions have a depth of from about 100 to about 300 nm, and are typically spaced about 1F from each other. Preferably, the SIT width is 2F, which permits the formation of bitlines having about a 3F pitch.

The second nitride layer, i.e., layer 45, is removed selective to oxide, leaving the first SiN (pad layer) over areas of the substrate which will later become the active areas (channels) for the vertical MOSFETs. A short dilute HF etch or other like etch is then used to open the thin oxide layer above the polysilicon placeholder material so as to expose the top of the placeholder material, while leaving portions of the substrate protected by the pad SiN layer.

Next, any one of several known one-sided strap processes including masked and maskless may be employed. For example, the one-side strap process may comprise the steps of: (1) removing (masked or maskless) a portion of the polysilicon placeholder material (selective to SiN liner) on the side of the deep trench where a strap is to be formed; (2) removing of the exposed collar oxide material by utilizing an isotropic oxide etching process; (3) removing the portion of the SiN liner that is not protected by the remaining region of the polysilicon placeholder material; (4) removing the remaining polysilicon placeholder material; (5) opening a portion of the oxide layer over the deep trench polysilicon not covered by the SiN liner; (6) continuing the oxide etching so as to form a divot in the top collar oxide at approximately the top level of the deep trench polysilicon; and (7) filling the divot with polysilicon so as to provide a bridge between the deep trench polysilicon and the sidewall of the trench. The above described processing steps, i.e., (1)–(7), are exemplary in nature and by no means limit the scope of the present invention. Instead, other well known one-sided strap (OSS) processes are also contemplated and may be employed herein.

Figure 12A:
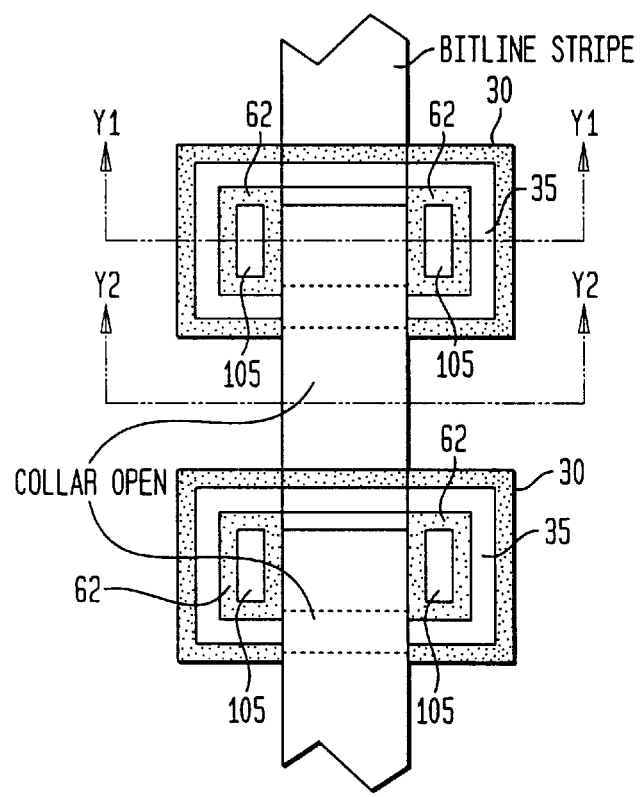
Figure 12B:
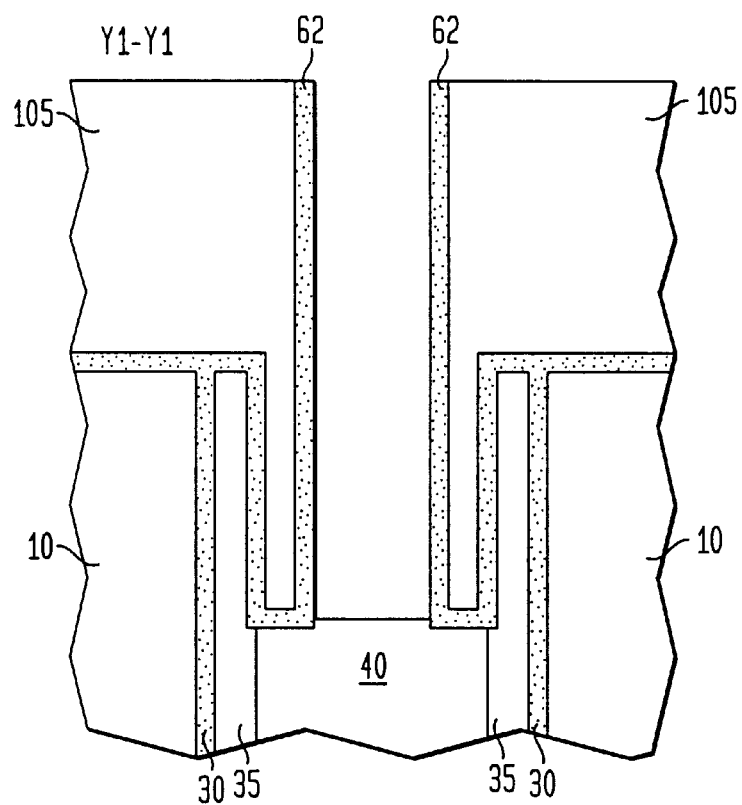
Figure 12C:
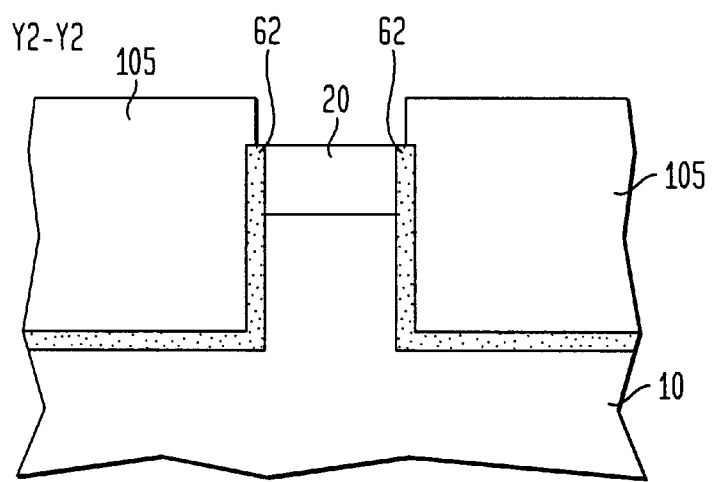
Figure 13A:
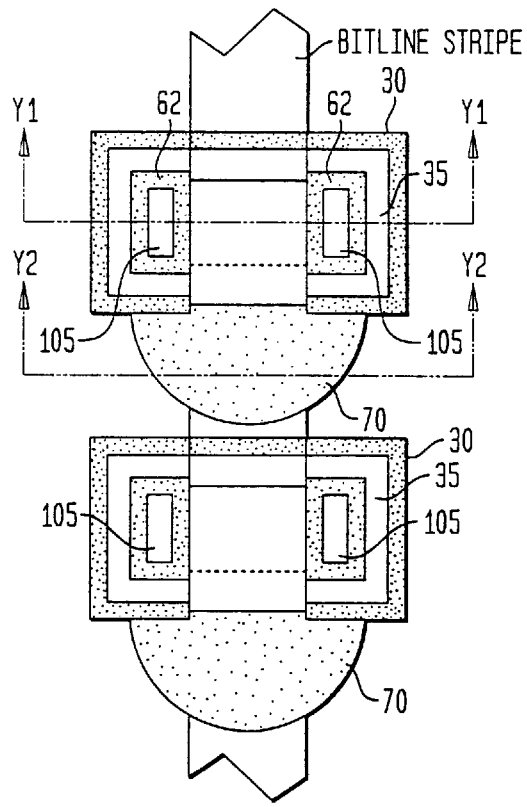
Figure 13B:
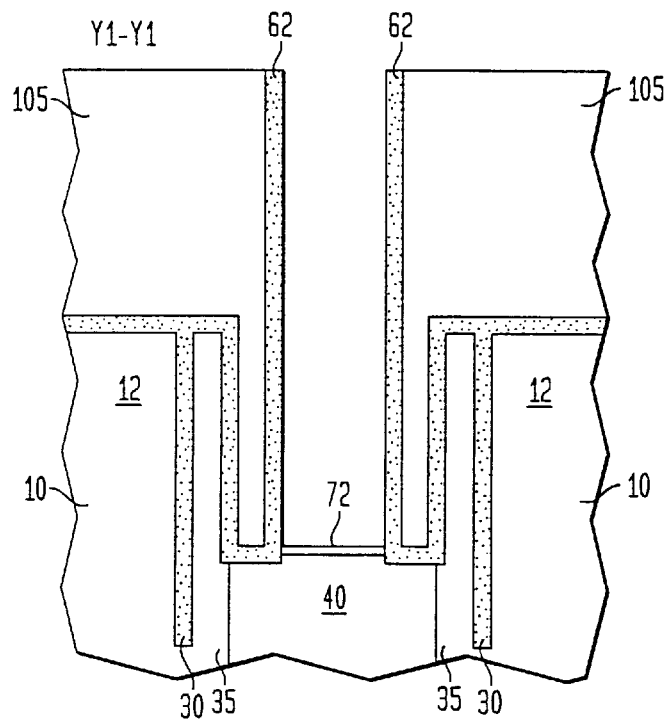
Figure 13C:
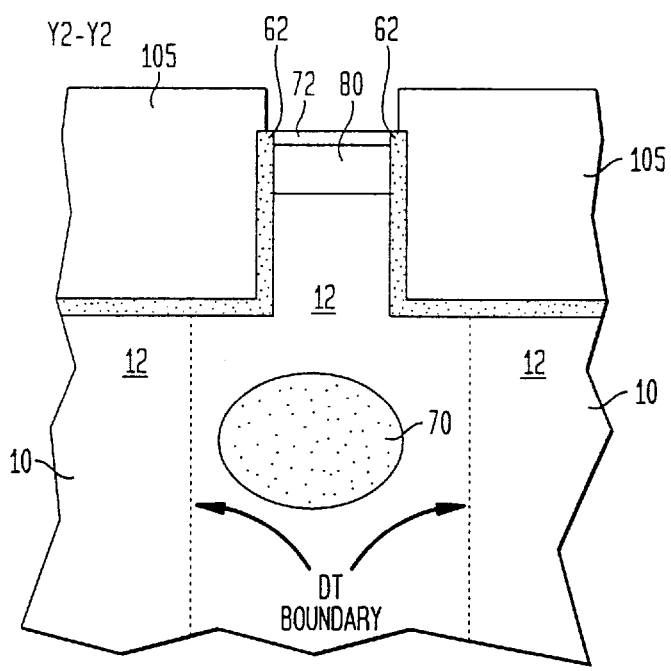
Figure 14A:
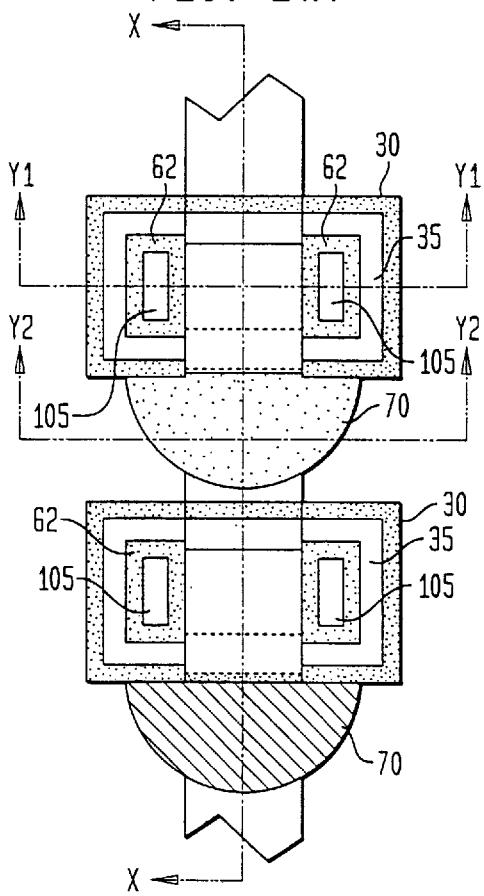
Figure 14B:
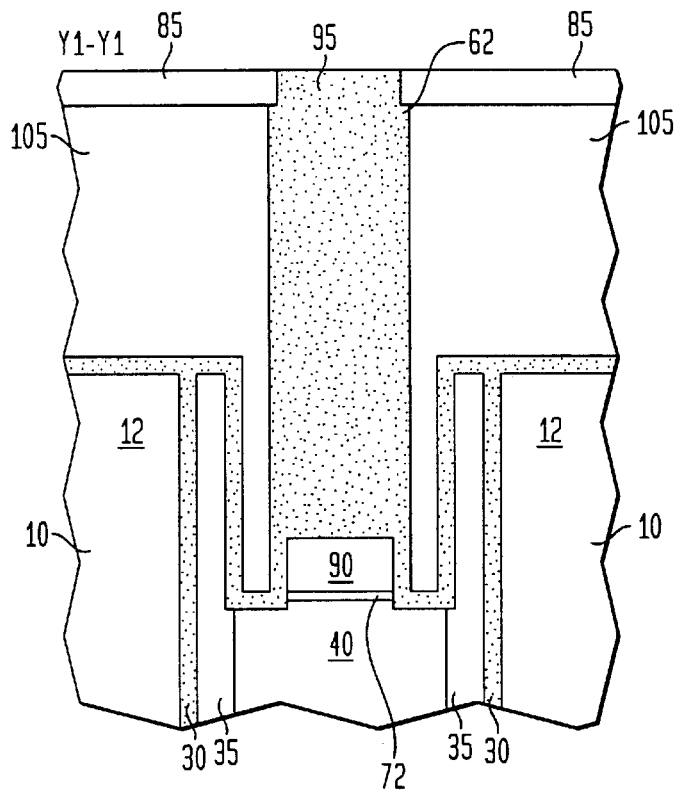
Figure 14C:
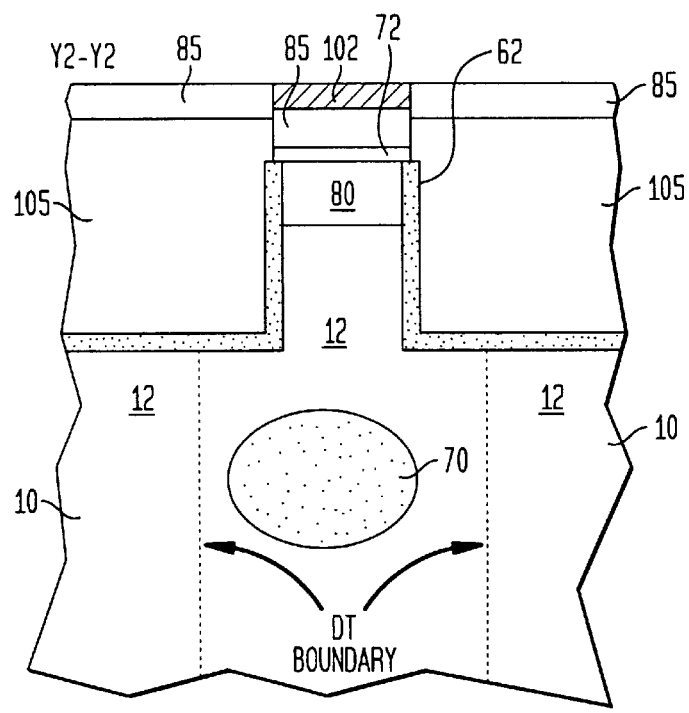
Figure 14D:
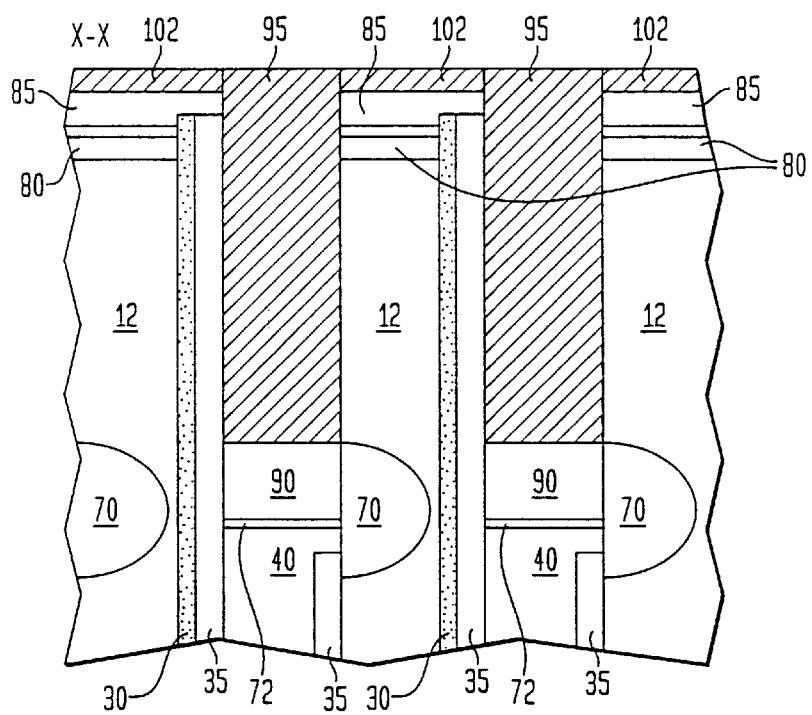
Figure 15A:
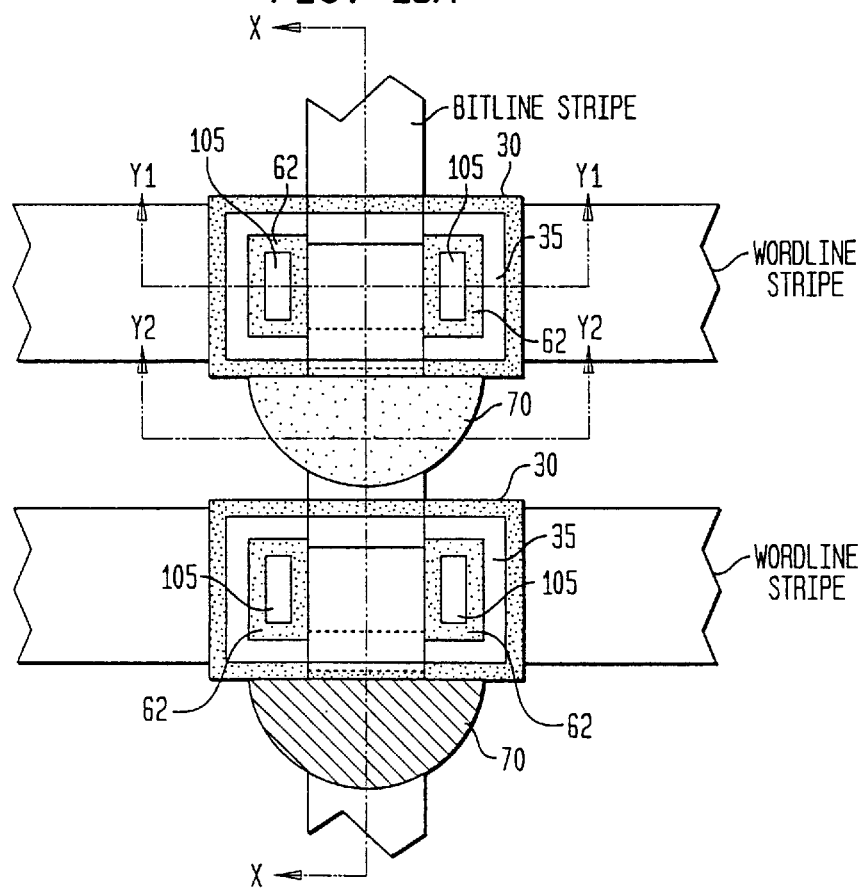
Figure 15B:
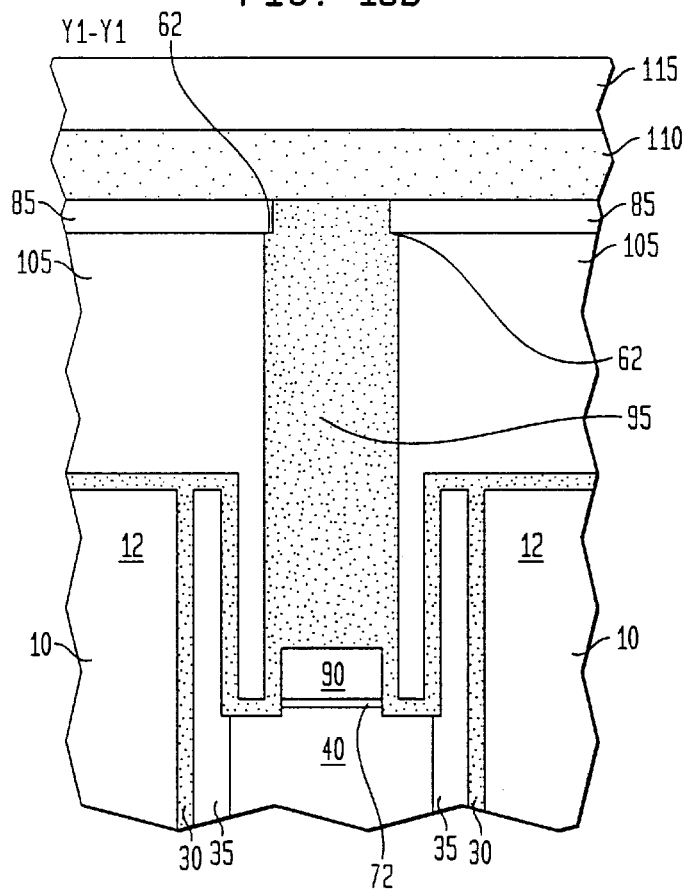
Figure 15C:
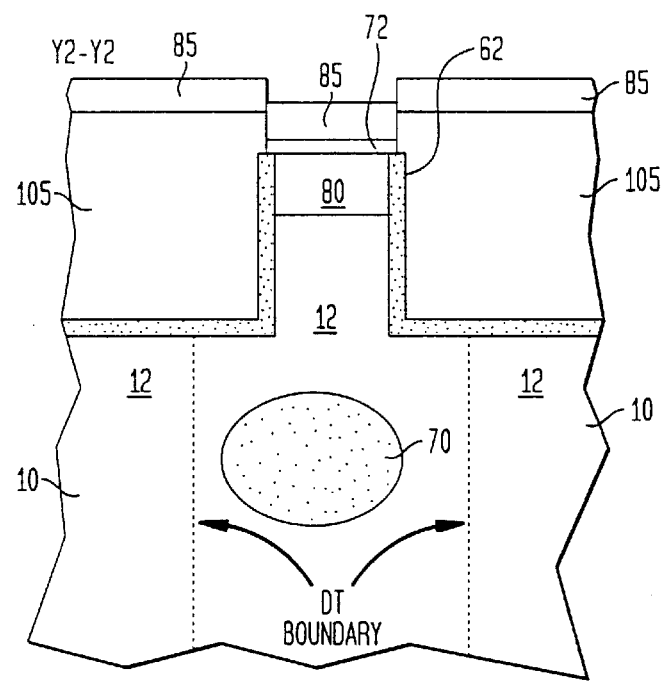
Figure 15D:
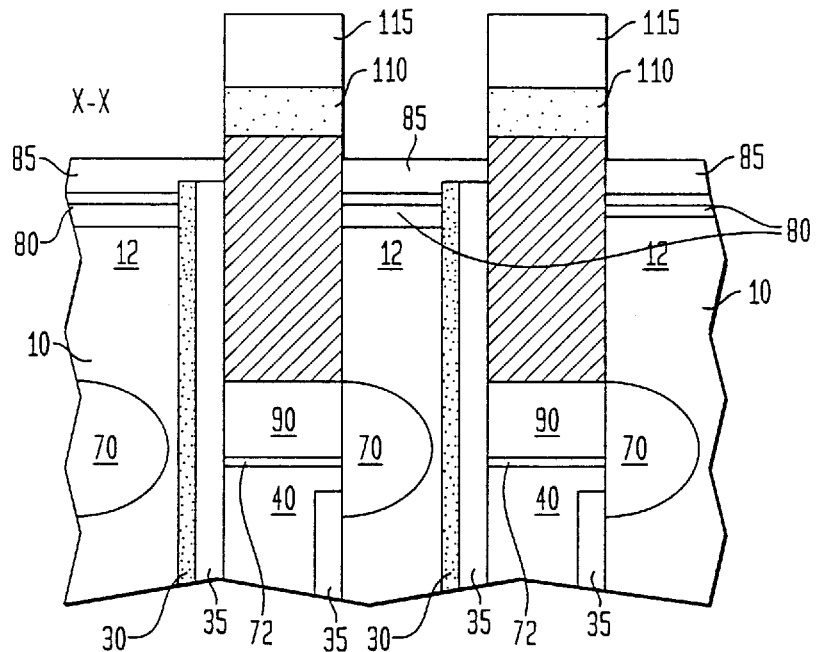
Figure 16A:
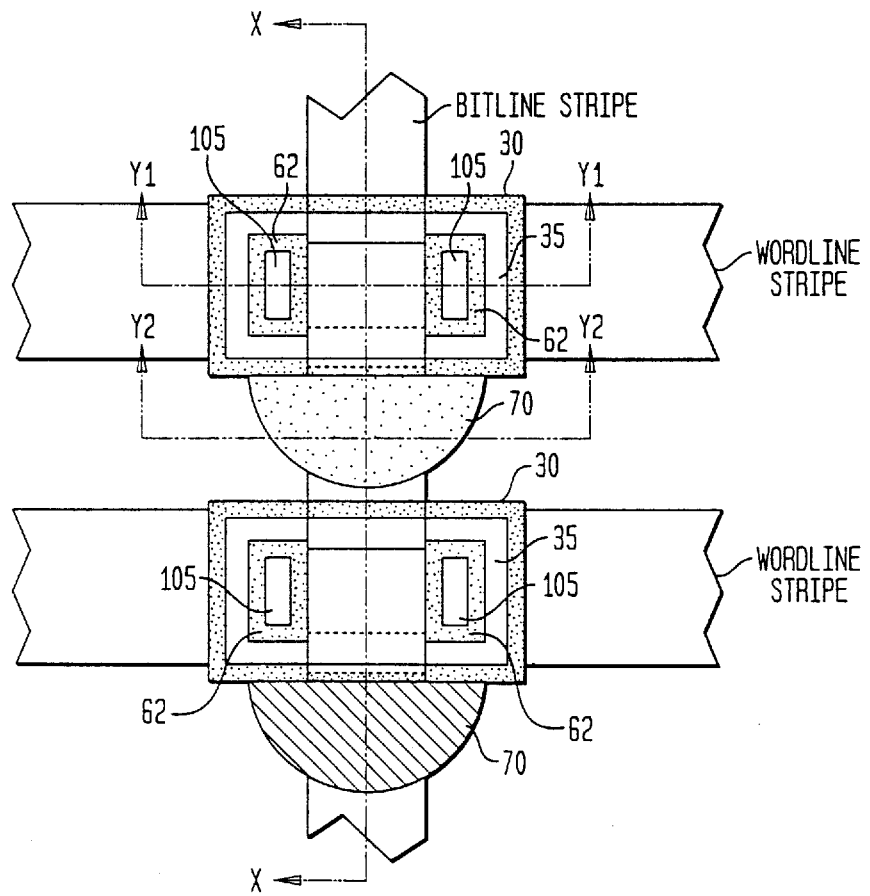
Figure 16D:
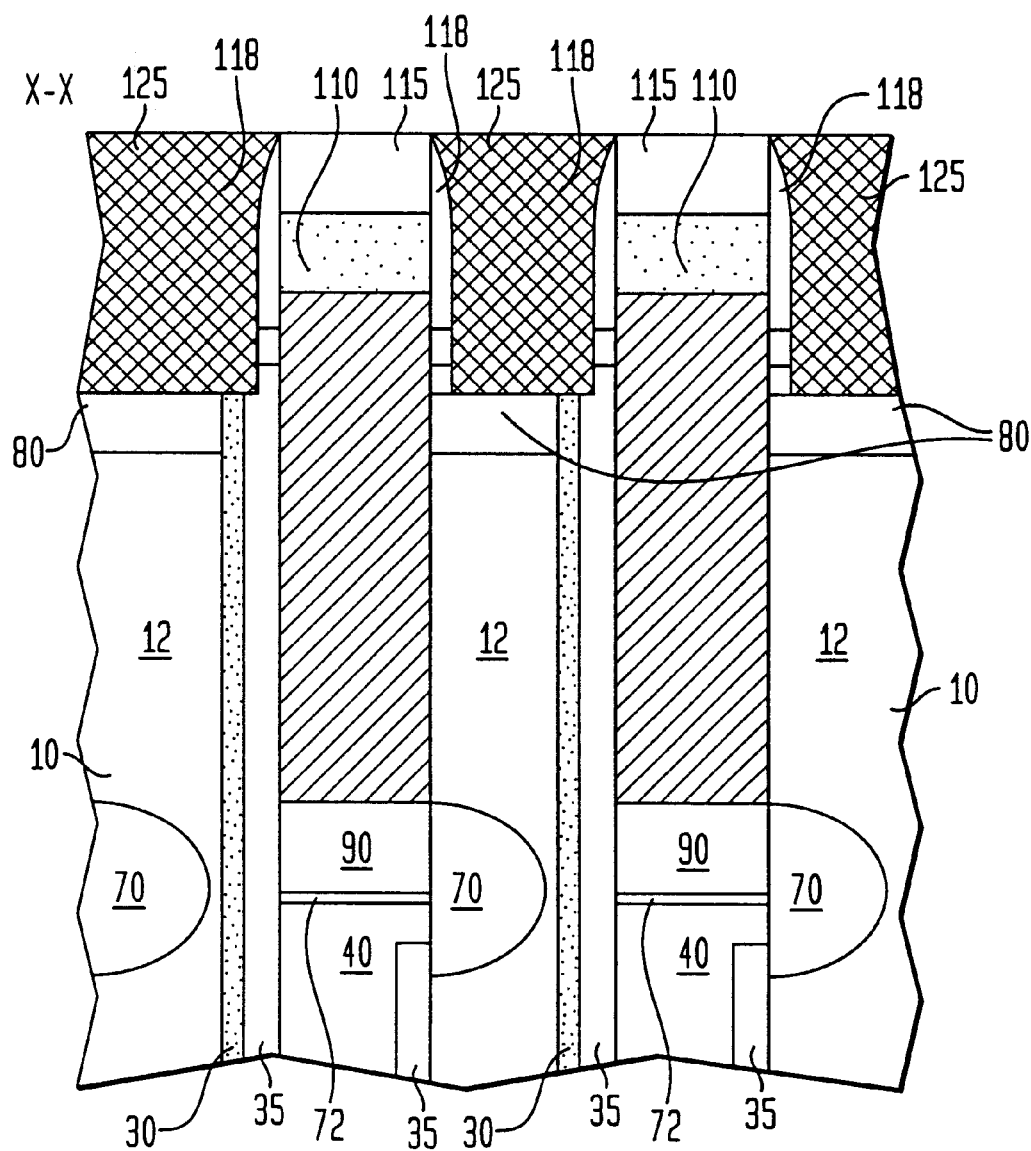

Notwithstanding which OSS process is employed, the OSS process will result in the structure shown in FIGS. 12A, 12B and 12C of the present application. Next, and as illustrated in FIGS. 13A, 13B and 13C, a screen oxide 72 is grown on the horizontal exposed surface of the deep trench polysilicon and bitline diffusion 80 and array well (not shown) implants are formed by conventional ion implantation. At this point of the process, support wells are also implanted and buried-strap outdiffusion region 70 is formed. During the above-mentioned implants, P-well region 12 is formed in the top portion of substrate 10.

Following the above-mentioned implants, the structure shown in FIGS. 14A, 14B, 14C and 14D is provided. Specifically, the structure shown in those figures is formed by first depositing a HDP trench top oxide 85 on the structure. The array MOSFET gate oxide 90 is then grown and a gate conductor 95 such as N+ polysilicon is formed utilizing either an in-situ doping deposition process or deposition followed by ion implantation; The gate conductor polysilicon fills the aperture and is then planarized to the highest top surface of the TTO oxide. A thin protective nitride layer (ES nitride) 102 is then formed by a conventional deposition process on the surface. The ES nitride is opened in the supports and protects the array areas during standard support device processing. Support device processing includes growth of a gate oxide and deposition of a support gate polysilicon layer. The support gate oxide is thereafter removed from the array region selective to the ES nitride. The ES nitride is then stripped by a conventional process leaving the top surface of the array gate conductor polysilicon exposed.

A wordline/gate conductor wiring layer stack consisting of a conductive portion 110 such as W and WN layers or $WSi_x$ layer, and an insulating cap 115 (e.g., SiN) is then deposited. As is recognized in the art, the insulating cap is required to subsequently form borderless bitline contacts to the wordline conductor. The wordline stack is patterned into wordlines, and into a wiring level connecting support gates; See FIGS. 15A, 15B, 15C and 15D. The Tro prevents shortening between the wordlines and bitline diffusions.

Next, as practiced by those skilled in the art, insulating spacers 118 are formed on the sidewalls of the wordlines, a thin etch stop layer of SiN is deposited (not shown), and a planarizing glass layer, e.g., boron phosphorus doped silicate glass (BPSG) or other like interlevel dielectric 120 is deposited and polished to the insulating cap. Contact vias are patterned and etched selective to SiN in the BPSG, stopping on the thin nitride barrier layer (not shown). The exposed portion of the nitride barrier layer is removed and oxide RIE through the TTO to the surface of the silicon is performed. Next, N+ polysilicon is deposited, filling the vias, and planarized to the top surface of the BPSG. The polysilicon studs 125 form connections between the bitline diffusion and bitline conductors to be subsequently formed, See FIGS.

16A, 16B, 16C and 16D. Standard processing continues through final levels of metallization.

In summary, the above process steps results in the formation of a hybrid-type cell (6F$^2$) which avoids strap-to-strap leakage problems to F=60 nm at $V_{blh}$=1.5 V. Moreover, the inventive process results in a well contact scheme which eliminates the floating-well effects which limit the scaling of the conventional hybrid cell. Furthermore, the inventive process uses shallow SIT throughout the chip (array and supports) for reduced aspect ratio and ease of fabrication, and it allows for tighter support circuitry groundrules due to smaller aspect ratio SITs. Additionally, the inventive process provides limited area strap aperture defined by side-oxide regions in the storage trench which results in reduced sensitivity to the channel width, and it allows spacing between SIT regions greater than about 1F, if desired, without critical overlay concerns since the strap cut is no longer defined by the isolation trench region.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A process of forming a memory cell array comprising the steps of:
    (a) forming at least one deep trench capacitor in a Si-containing substrate, said at least one deep trench capacitor including at least a deep trench polysilicon material, a trench oxide formed on said deep trench polysilicon material, a liner formed on said trench oxide and interior walls of a collar oxide region, and a polysilicon placeholder material formed on said liner;
    (b) patterning said polysilicon placeholder material using at least a hardmask to cover a middle portion of said deep trench capacitor and selectively etching exposed portions of said polysilicon placeholder material stopping on said liner;
    (c) removing exposed portions of said liner stopping on said trench oxide so as to expose portions of said trench oxide and removing said exposed portions of said trench oxide stopping on said deep trench polysilicon material;
    (d) oxidizing any exposed sidewalls and providing a planarized layer of oxide in said etched areas so as to form shallow isolation trench regions which have a depth that is substantially above a buried-strap outdiffusion region to be subsequently formed thereby not cutting into said buried-strap outdiffusion region, yet being deep enough to isolate adjacent bitline diffusion regions to be subsequently formed;
    (e) removing said hard mask from said middle portion of the deep trench capacitor, and selectively etching through said remaining polysilicon placeholder material, liner and trench oxide so as to expose a portion of said deep trench polysilicon material;
    (f) providing a strap opening in said deep trench capacitor and forming a one-sided buried-strap outdiffusion region through said strap opening, said one-sided buried strap outdiffusion region being confined to a substantially center portion of the deep trench capacitor;
    (g) forming bitline diffusion regions about said deep trench capacitor; and
    (h) forming a new trench oxide on said exposed portion of said deep trench polysilicon and forming a gate conductor on said trench oxide.

2. The process of claim 1 further comprising forming wordlines above said deep trench capacitor, forming borderless bitline contacts adjacent to said wordlines and forming bitlines above and perpendicular to said wordlines that are in contact with said bitline contacts.

3. The process of claim 2 wherein said bitlines have approximately a 3F pitch.

4. The process of claim 2 wherein said wordlines include a conductive portion and an insulating cap formed on said conductive portion.

5. The process of claim 4 wherein said conductive portions includes W/WN layers or WSi$_x$ layers.

6. The process of claim 4 wherein said insulating cap is comprised of SiN.

7. The process of claim 2 wherein said wordlines include spacers formed on sidewalls thereof.

8. The process of claim 1 wherein said deep trench capacitor is formed by the steps of: forming a pad structure on said Si-containing substrate; patterning said pad structure via lithography; etching a deep trench into said Si-containing substrate; forming a liner on exposed interior walls of said deep trench; forming an oxide collar on sidewalls of said liner; forming a buried plate diffusion region in a lower portion of said deep trench; forming a node dielectric about said buried plate diffusion region; forming a recessed deep trench polysilicon material layer in said deep trench; forming an trench oxide on said recessed deep trench polysilicon material; lining exposed walls of said collar oxide and said trench oxide with a second liner; and forming a polysilicon placeholder material layer on said second liner.

9. The process of claim 1 wherein step (b) includes lithography and etching.

10. The process of claim 1 wherein step (c) includes an anisotropic etching process which is selective to said liner and an oxide.

11. The process of claim 1 wherein said oxide fill is comprised of tetraethylorthosilicate or high density plasma oxide.

12. The process of claim 1 wherein said shallow isolation trench-region have a depth of from about 100 to about 300 nm.

13. The process of claim 1 wherein step (f) includes a one-sided strap process.

14. The process of claim 13 wherein said one-sided strap process includes removing a portion of the polysilicon placeholder material using an etch process that is selective to said liner on a side of the deep trench where a strap is to be formed; removing the exposed collar oxide by utilizing an isotropic oxide etching process; removing a portion of the liner that is not protected by the remaining region of the polysilicon placeholder material; removing the remaining polysilicon placeholder material; opening a portion of the oxide layer over the deep trench polysilicon not covered by the liner; continuing the oxide etching so as to form a divot in the top collar oxide at approximately the top level of the deep trench polysilicon; and filling the divot with polysilicon so as to provide a bridge between the deep trench polysilicon and the sidewall of the trench.

15. The process of claim 1 wherein said bitline diffusions are formed by implantation.

* * * * *